(12) United States Patent
Bikumandla et al.

(10) Patent No.: US 10,475,834 B1
(45) Date of Patent: Nov. 12, 2019

(54) APPARATUSES, SYSTEMS, AND METHODS FOR DISRUPTING LIGHT AT A BACK-SIDE OF AN IMAGE SENSOR ARRAY

(71) Applicant: FACEBOOK TECHNOLOGIES, LLC, Menlo Park, CA (US)

(72) Inventors: Manoj Bikumandla, Union City, CA (US); Andrew Matthew Bardagjy, Fremont, CA (US); Cina Hazegh, Walnut Creek, CA (US); Scarlett Rodriguez, Sunnyvale, CA (US)

(73) Assignee: Facebook Technologies, LLC, Menlo Park, CA (US)

( * ) Notice: Subject to any disclaimer, the term of this patent is extended or adjusted under 35 U.S.C. 154(b) by 56 days.

(21) Appl. No.: 15/727,547

(22) Filed: Oct. 6, 2017

(51) Int. Cl.
*H01L 27/146* (2006.01)
*G02B 27/01* (2006.01)
*B23P 19/04* (2006.01)
*H04N 5/335* (2011.01)

(52) U.S. Cl.
CPC ........ *H01L 27/14623* (2013.01); *B23P 19/04* (2013.01); *G02B 27/0101* (2013.01); *G02B 27/0172* (2013.01); *H01L 27/14621* (2013.01); *H04N 5/335* (2013.01)

(58) Field of Classification Search
CPC ........ H01L 27/14623; H01L 27/14621; G02B 27/0101; G02B 27/0172; G02B 5/003; G02B 27/0018; H04N 5/335; H04N 5/357; H04N 5/359; B23P 19/04; G02F 1/133512
USPC .................................................. 348/241, 242
See application file for complete search history.

(56) References Cited

U.S. PATENT DOCUMENTS

| | | | |
|---|---|---|---|
| 7,238,960 B2* | 7/2007 | Sundaram | B82Y 20/00 250/214.1 |
| 7,830,412 B2* | 11/2010 | Chinnaveerappan | H01L 27/14654 257/660 |
| 9,196,762 B2* | 11/2015 | Saito | H01L 27/1462 |
| 10,116,925 B1* | 10/2018 | Wang | H04N 5/3696 |
| 2008/0106626 A1* | 5/2008 | Tatani | H01L 27/1462 348/308 |
| 2010/0321544 A1* | 12/2010 | Matsuo | H01L 21/76898 348/294 |

(Continued)

OTHER PUBLICATIONS

Yokogawa et al.; IR sensitivity enhancement of CMOS Image Sensor with diffractive light trapping pixels; Scientific Reports 7, Article No. 3832 (Published Jun. 19, 2017).

(Continued)

*Primary Examiner* — Albert H Cutler
(74) *Attorney, Agent, or Firm* — FisherBroyles, LLP

(57) ABSTRACT

An imaging device may include (1) an aperture, (2) a camera lens positioned to direct light received through the aperture to a plurality of image sensor elements at a front side of an image sensor array, and (3) the image sensor array. The plurality of image sensor elements may collect a portion of the light received through the aperture. A light-disrupting element may be disposed at a back side of the image sensor array. The light-disrupting element at the back side of the image sensor array may prevent at least a portion of the light that is not collected by the plurality of image sensor elements from reflecting back to the plurality of image sensor elements. Various other devices, systems, and methods are also disclosed.

20 Claims, 11 Drawing Sheets

(56) References Cited

U.S. PATENT DOCUMENTS

| | | | |
|---|---|---|---|
| 2011/0051251 A1* | 3/2011 | Endoh | G02B 27/0018 |
| | | | 359/614 |
| 2011/0242407 A1* | 10/2011 | Lee | H04N 5/2254 |
| | | | 348/374 |
| 2011/0266644 A1* | 11/2011 | Yamamura | H01L 27/1462 |
| | | | 257/431 |
| 2014/0021573 A1* | 1/2014 | Nishimaki | H01L 27/14607 |
| | | | 257/431 |
| 2014/0361957 A1* | 12/2014 | Hua | G06F 3/013 |
| | | | 345/8 |
| 2015/0256725 A1* | 9/2015 | Jiang | H04N 5/2253 |
| | | | 348/373 |
| 2018/0097975 A1* | 4/2018 | Osman | H04N 13/106 |
| 2019/0103437 A1* | 4/2019 | Su | H01L 27/14685 |

OTHER PUBLICATIONS

Etchells; Sigma Q&A Part II: Does Foveon's Quattro sensor really out-resolve conventional 36-megapixel chips?; http://www.imaging-resource.com/news/2014/04/08/sigma-qa-part-ii-does-foveons-quattro-sensor-really-outresolve-conventional; as accessed on Oct. 30, 2017 (dated Apr. 8, 2014).

* cited by examiner

APPARATUSES, SYSTEMS, AND METHODS FOR DISRUPTING LIGHT AT A BACK-SIDE OF AN IMAGE SENSOR ARRAY

BACKGROUND

Augmented reality and virtual reality systems may rely on an imaging device, such as a camera or a sensor, for depth sensing. A conventional imaging device in such systems may project light into an area and determine the depth of objects within the area based on light backscattered from the objects after the light has been projected. However, background ambient light and/or light of specific wavelength bands (e.g., infrared light) may interfere with image sensor measurements, particularly when such light passes through the image sensor and is back-reflected by components behind the image sensor, a phenomenon sometimes known as "package ghosting." Thus, the instant disclosure identifies and addresses a need for improved apparatuses, systems, and methods for efficiently disrupting various light components received by an imaging device, including back-reflected light components, in augmented and virtual reality environments.

SUMMARY

As will be described in greater detail below, the instant disclosure describes various apparatuses, systems, and methods for disrupting light at a back side of an image sensor array. In one example, an imaging device may include (1) an aperture, (2) a camera lens positioned to direct light received through the aperture to a plurality of image sensor elements at a front side of an image sensor array, and (3) the image sensor array. In this example, (1) the plurality of image sensor elements may collect a portion of the light received through the aperture, (2) a light-disrupting element may be disposed at a back side of the image sensor array, and (3) the light-disrupting element at the back side of the image sensor array may prevent at least a portion of the light that is not collected by the plurality of image sensor elements from reflecting back to the plurality of image sensor elements.

In some examples, the light-disrupting element may represent an uneven surface etched directly on the back side of the image sensor array. In this example, the uneven surface may include at least one of a plurality of protrusions or a plurality of ridges. In some examples, each of the plurality of protrusions may include a plurality of surface portions extending to an apex. In at least one example, the uneven surface may include at least one of a patterned etching or a non-patterned etching. Additionally or alternatively, the light-disrupting element may represent a printable element printed on the back side of the image sensor array. In one embodiment, the light-disrupting element may represent a light-absorbing layer disposed on the back side of the image sensor array. In one such embodiment, the light-absorbing layer may represent an adhesive. Additionally, the imaging device may further include a printed circuit board positioned behind the image sensor array, which may be affixed to the back side of the image sensor array via the light-absorbing layer.

In one example, the imaging device may be part of a local area imaging assembly configured to determine a depth between the local area imaging assembly and one or more objects in an area surrounding the local area imaging assembly. In some examples, the local area imaging assembly may be coupled to a head-mounted display (e.g., a virtual reality headset and/or an augmented reality headset). In another example, the local area imaging assembly may be coupled to an external sensor device (e.g., an external sensor bar). In at least one example, the imaging device may be part of a local area imaging assembly configured to track at least one object in an area surrounding the local area imaging assembly In addition, a corresponding system may include a head-mounted display and an imaging device that includes one or more of the features described above (e.g., an aperture, a camera lens positioned to direct light received through the aperture to a plurality of image sensor elements at a front side of an image sensor array, and the image sensor array). In one embodiment, the system may also include a local area imaging assembly that includes the imaging device an illumination source that emits light onto the one or more objects such that the emitted light is reflected back to the local area imaging assembly after reaching the one or more objects. In this embodiment, (1) the light received through the aperture may represent the light reflected back from the one or more objects and (2) the local area imaging assembly may be configured to determine the depth between the local area imaging assembly and the one or more objects based on the light reflected back from the one or more objects.

In some embodiments, the system may include a hand-held controller that includes at least one light-emitting element. In this example, the light received through the aperture may include light emitted by the at least one light-emitting element of the hand-held controller. The imaging device may be part of a local area imaging assembly configured to track the hand-held controller based on the light emitted by the at least one light-emitting element of the hand-held controller.

In one example, a corresponding method may include (1) forming a light-disrupting element at a back side of an image sensor array (e.g., an image sensor array with one or more of the features described above) such that the light-disrupting element at the back side of the image sensor array prevents at least a portion of the light that is not collected by the plurality of image sensor elements from reflecting back to the plurality of image sensor elements, (2) coupling the back side of the image sensor array to a front side of a printed circuit board, and (3) positioning the printed circuit board within an imaging device behind a camera lens positioned to direct light received through the aperture of the imaging device to the plurality of image sensor elements at the front side of the image sensor array.

In some examples, the method may further include etching the light-disrupting element on the back side of the image sensor array. Additionally or alternatively, the method may further include printing the light-disrupting element on the back side of the image sensor array. In one embodiment, the light-disrupting element may include a light-absorbing layer. In this example, forming the light-disrupting element may include coupling the light-absorbing layer to the back side of the image sensor array. In one example, the light-absorbing layer may include an adhesive. In this example, coupling the back side of the image sensor array to the front side of the printed circuit board may include using the light-absorbing layer to couple the back side of the image sensor array to the front side of the printed circuit board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
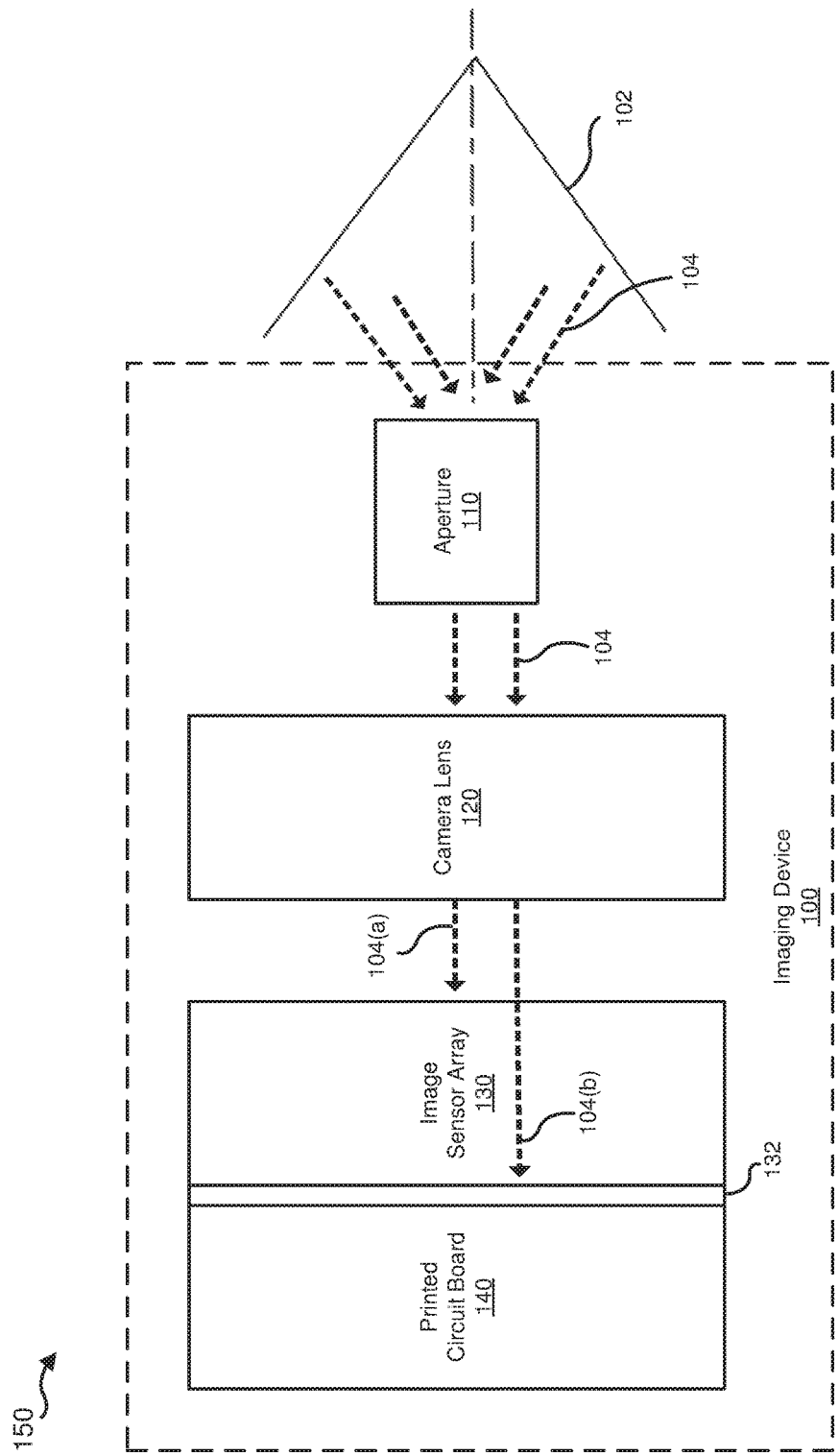
FIG. 1 is a block diagram of an exemplary imaging device, in accordance with an embodiment.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to apparatuses, systems, and methods for disrupting light at a back side of an image sensor array. As will be explained in greater detail below, embodiments of the instant disclosure may include a local area imaging assembly for a virtual reality headset. The local area imaging assembly may include an imaging device, such as a camera, that captures light reflected by a local area and traps components of the captured light, such as near infrared (NIR) light, at a back portion of the image sensor package to prevent image degradation due to, for example, package ghosting resulting from reflected light. A back side of a silicon die forming the image sensor array may be etched (e.g., laser etched) to form an uneven surface pattern that traps and/or destroys reflected NIR photons reflected from surfaces behind the silicon die, preventing the reflected NIR photons from reaching the light sensor regions. A coating and/or glue (such as a light-absorbing coating and/or glue) may also be applied to the back surface of the silicon die to trap the reflected NIR photons. The use of the NIR light-trapping features described herein may eliminate the need for a light-blocking filter, such as an infrared (IR) cut filter, in the imaging device. Thus, the disclosed NIR light-trapping features may improve the accuracy and performance of imaging devices while reducing costs associated with additional light-blocking elements.

The following will provide, with reference to FIGS. 1-10, detailed descriptions of exemplary artificial reality systems, imaging devices, headsets, local area imaging assemblies, and image sensor arrays that may be used to prevent light from passing through an image sensor array. In addition, the discussion corresponding to FIG. 11 will provide an exemplary method for forming a light-disrupting element for preventing light from passing through an image sensor array.

FIG. 1 illustrates an exemplary system, such as an artificial reality system 150, that includes an imaging device 100. As shown in FIG. 1, imaging device 100 may be configured for imaging a local area 102 surrounding some or all of imaging device 100. In some examples, local area 102 may represent an indoor environment. In other examples, local area 102 may represent an outdoor environment. Imaging device 100 may include a variety of elements, including (without limitation) an aperture 110, a camera lens 120, an image sensor array 130, and a printed circuit board 140. Aperture 110 may receive light 104 from local area 102 and camera lens 120 may be positioned behind aperture 110 to direct light 104 to a front side of image sensor array 130. In some embodiments, printed circuit board 140 may include one or more components that interface with and/or control aperture 110, camera lens 120, and/or image sensor array 130. In some examples, as will be described later in connection with FIG. 9, light 104 may represent light that has been backscattered from one or more objects in local area 102 after having been emitted into local area 102 by an illumination source.

In some examples, aperture 110 is an opening in an imaging device through which light may travel. In some examples, camera lens 120 is an optical assembly that focuses and/or disperses light by means of refraction. In some examples, camera lens 120 may refer to a single piece of transparent material. In other examples, camera lens 120 may refer to an assembly of several lenses (e.g., arranged along a common access).

In some examples, image sensor array 130 may be an integrated circuit that includes an array of light sensors (e.g., light-sensing photodiode elements) that capture and measure light. In some examples, the array of light sensors may capture particular ranges of wavelengths of light (i.e., "bands" of light) (e.g., approximately 400 nm to approximately 900 nm). In some embodiments, artificial reality system 150 may distinguish between certain components of light captured by the array of light sensors. For example, as will be described in greater detail below, artificial reality system 150 may distinguish between a range of light wavelengths in a visible band between, for example, approximately 400 nm to approximately 700 nm and a range of light wavelengths in an IR band between, for example, greater than approximately 700 nm to approximately 900 nm. In one embodiment, the array of light sensors may include complementary metal-oxide-semiconductor (CMOS) image sensors and/or charge-coupled device (CCD) image sensors. In some examples, the array of light sensors may be supported within the image sensor array on and/or within a silicon die.

In some examples, a printed circuit board 140 is a non-conductive material, such as a plastic or glass-fiber substrate, that mechanically supports and/or electrically connects electronic components. In some examples, conductive lines (e.g., copper traces) may be printed or etched on the non-conductive material.

Figure 2:
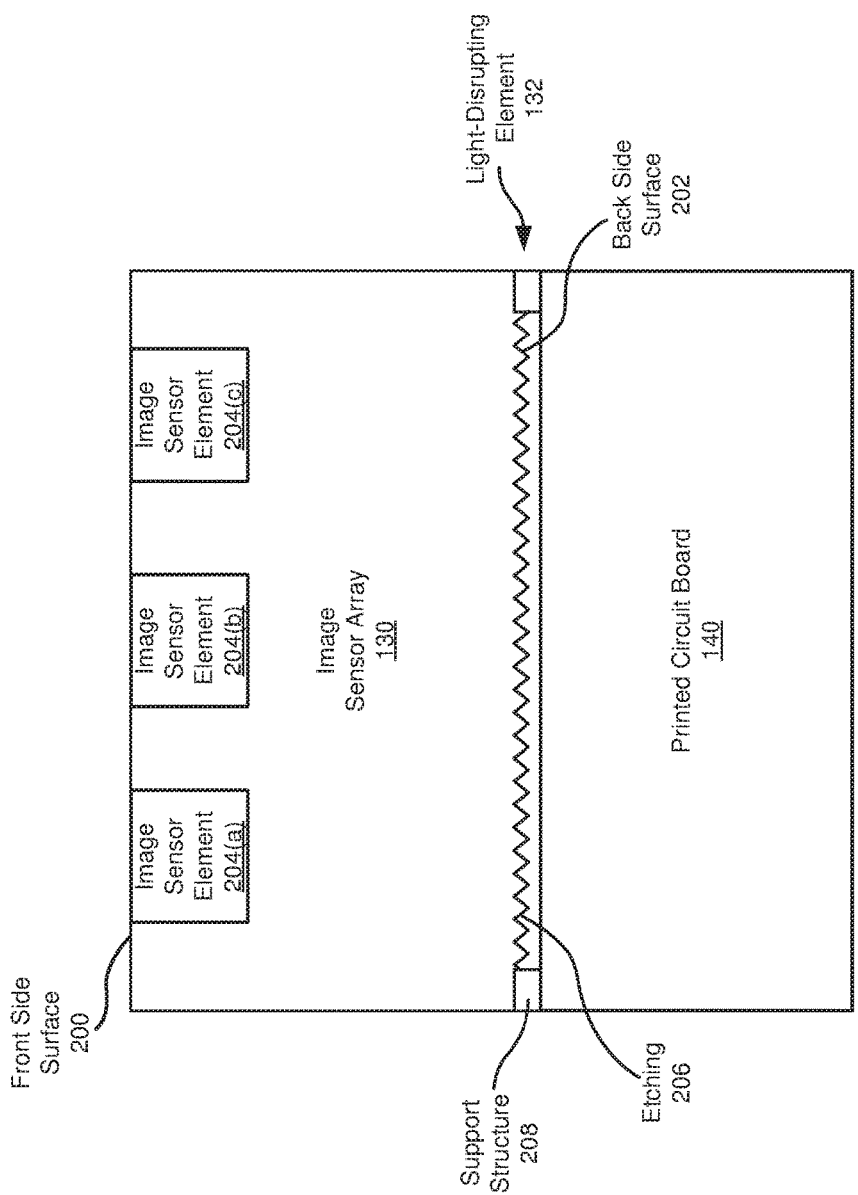
FIG. 2 is a cross-sectional side view of an exemplary image sensor array, with an etched back side surface, coupled to an exemplary printed circuit board, in accordance with some embodiments.
Figure 5:
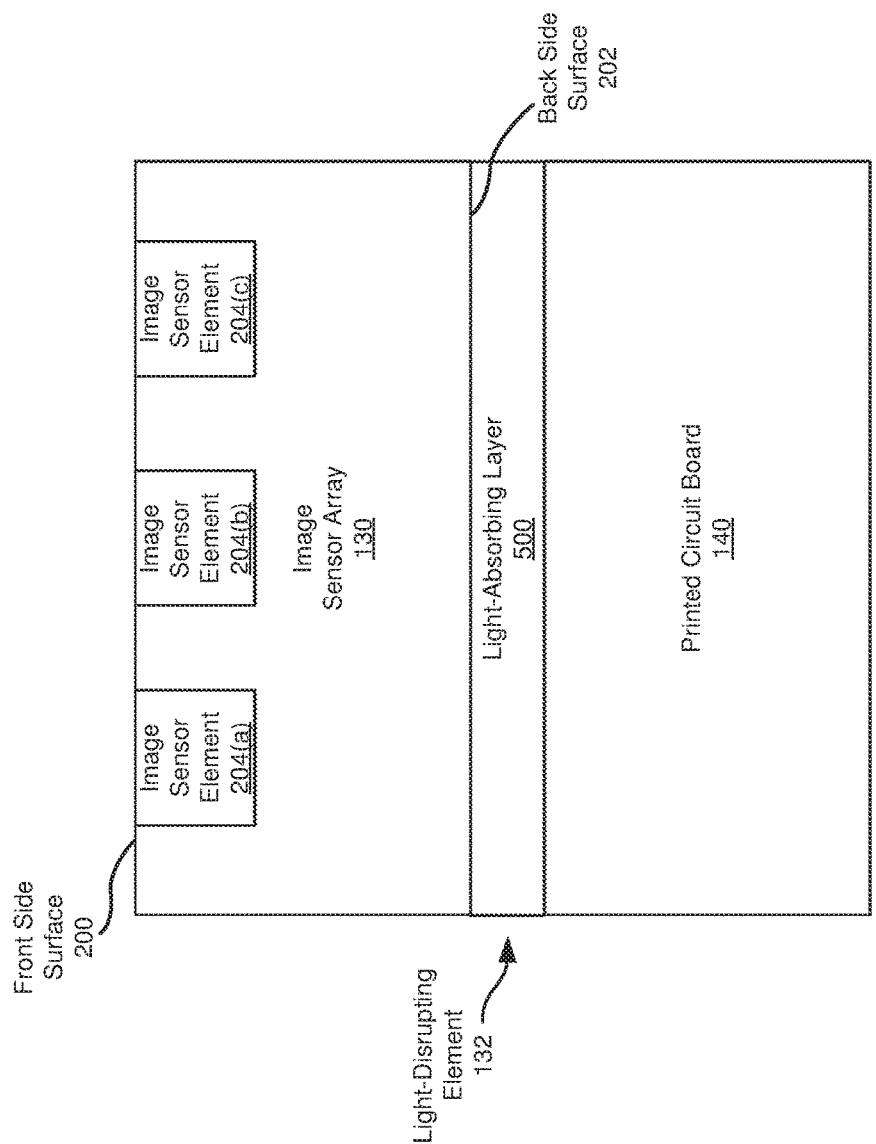
FIG. 5 is a cross-sectional side view of an exemplary image sensor array, with a light-absorbing layer, coupled to an exemplary printed circuit board, in accordance with some embodiments.
Figure 7:
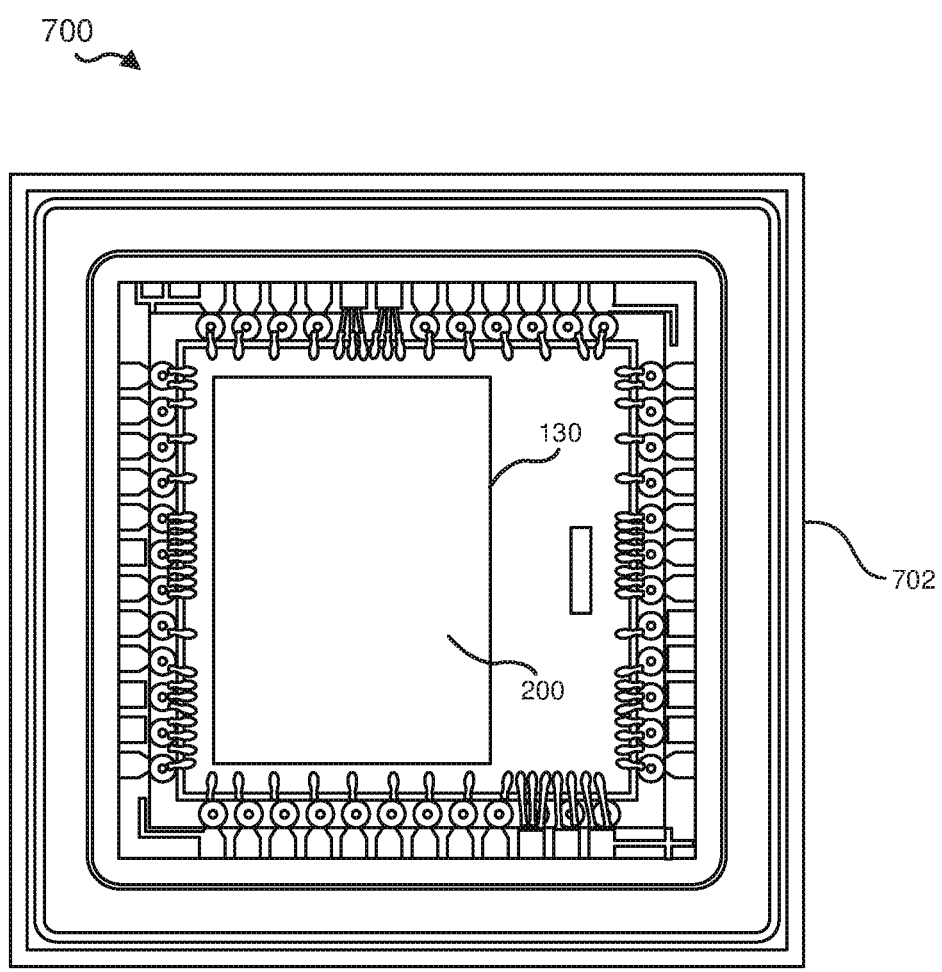
FIG. 7 is a front view of an exemplary image sensor including an image sensor array, in accordance with some embodiments.

In some examples, image sensor array 130 may include a semiconductor material, such as a crystalline silicon die or substrate, having a front side and a back side. For example, as illustrated in FIGS. 2 and 5, image sensor array 130 may include a front side surface 200 and a back side surface 202. Light passing through aperture 110 and camera lens 120 illustrated in FIG. 1 may be incident on front side surface 200 of image sensor array 130. In some embodiments, image sensor array 130 may include an array of light sensor elements (e.g., image sensor elements 204(*a*)-(*c*) illustrated in FIGS. 2 and 5) disposed at or near front side surface 200. FIG. 7 illustrates a front view of an exemplary image sensor 700 that includes image sensor array 130. Image sensor 700 may represent any suitable image sensor, such as an active-pixel sensor (e.g., a CMOS sensor, CCD sensor, etc.) including an array of light sensor elements. Image sensor 700 may include an integrated circuit 702 that includes image sensor array 130. FIG. 7 shows front side surface 200 of image sensor array 130 at which an array of light sensor elements are disposed. In some embodiments, additional features (e.g., wiring and/or other electrical components, insulation layers, light-blocking layers, etc.) may be disposed on front side surface 200 and/or any other suitable portion of image sensor array 130.

In examples in which the array of light sensors captures a visible band, but does not capture an IR band (as described above), light within the IR band may continue on past the front side of image sensor array 130. Using FIG. 1 as a specific example, light 104 may include a band of light 104(*a*), which falls within the visible band, and a band of light 104(*b*), which falls within the IR band (NIR light). In this specific example, as illustrated in FIG. 1, band of light 104(*a*) may be captured at the front side of image sensor array 130, but band of light 104(*b*) may continue on past the front side of image sensor array 130, as will be explained in greater detail below in reference to FIG. 6.

In some examples (as illustrated in FIGS. 1-6), the back side of image sensor array 130 may include a light-disrupting element 132 that prevents light reflected from a region behind image sensor array 130 (e.g., printed circuit board 140) from reaching image sensor elements 204. In one embodiment, light-disrupting element 132 may be designed to disrupt light that was not initially captured by image sensor elements 204 at the front side of image sensor array 130. For example, in some embodiments, light-disrupting element 132 may be designed specifically to disrupt infrared light. In other embodiments, light-disrupting element 132 may be designed to disrupt any light that is not already captured at the front side of image sensor array 130.

Figure 3:
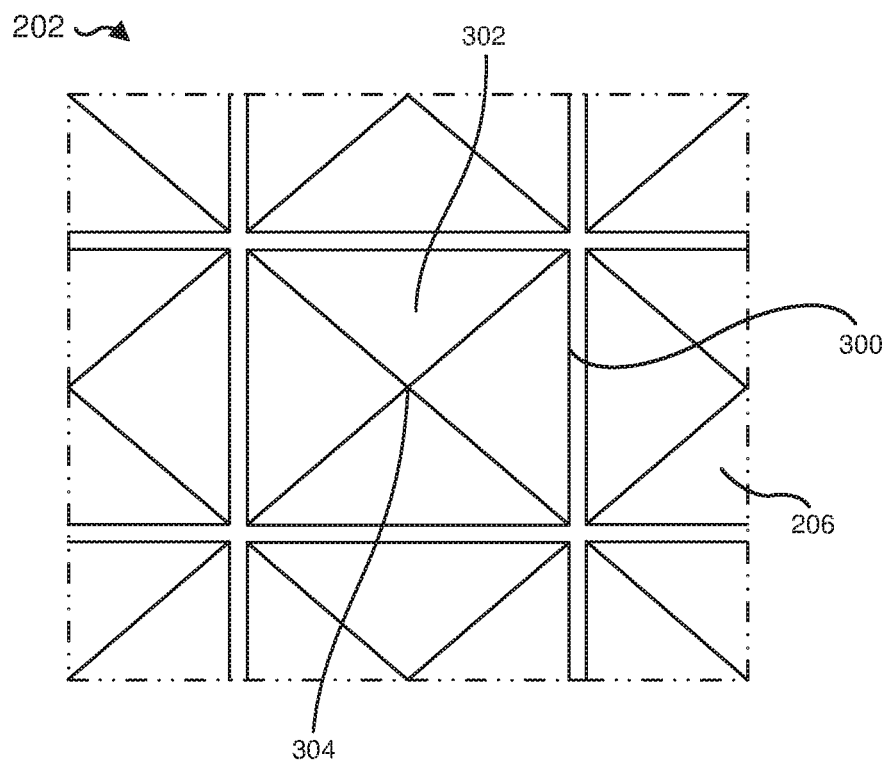
FIG. 3 is a back view of portion of an exemplary image sensor array, in accordance with some embodiments.

Light-disrupting element 132 may take on a variety of forms. In some examples, light-disrupting element 132 may represent an uneven surface etched directly on at least a portion of back side surface 202 of image sensor array 130. Using FIG. 2 as a specific example, light-disrupting element 132 may represent an etching 206 etched directly onto at least a portion of back side surface 202 of image sensor array 130. In some embodiments, etching 206 may take the form of a specific pattern. Using FIG. 3 as a specific example, etching 206 may include a patterned etching having a plurality of protrusions 300, such as a plurality of pyramid-shaped protrusions, etched onto back side surface 202 of image sensor array 130. As shown in FIG. 3, protrusions 300 may each, for example, have a plurality of protrusion surface portions 302 that extend to a protrusion apex 304. Protrusions 300 may be any suitable size and shape. In at least one embodiment, protrusions 300 may have a pitch (i.e., a distance between protrusion apexes 304 of adjacent protrusions 300) along back side surface 202 of from about 100 nanometers or less to several micrometers (e.g., less than about 100 nm, about 100 nm, about 200 nm, about 300 nm, about 400 nm, about 500 nm, about 600 nm, about 700 nm, about 800 nm, about 900 nm, about 1 µm, about 1.5 µm, about 2 µm, greater than about 2 µm).

Additionally or alternatively, etching 206 may include any suitable pattern for trapping and/or otherwise disrupting light, including, for example, a pattern of geometric and/or non-geometric protrusions, ridges, and/or any other suitable pattern. In some examples, etching 206 may represent a rough non-patterned etching that does not take the form of any organized pattern. Because etching 206 is disposed at the back side rather than the front side of image sensor array 130, etching 206 may be non-uniform since it will not interfere with light passing through front side surface 200 of image sensor array 130. Accordingly, in some examples, etching 206 may be formed on back side surface 202 using relatively crude and/or less cost-prohibitive techniques in comparison to surface modifications that might be made to front side surface 200 since etching 206 on back side surface 202 will not impact the quality (e.g., color purity, resolution, uniformity, etc.) of images captured by image sensor elements 204 of image sensor array 130. In at least one embodiment, etching 206 may result in light incident on back side surface 202 of image sensor array 130, such as light reflected from printed circuit board 140 and/or other components behind image sensor array 130, being trapped and/or otherwise disrupted such that the light does not reach image sensor elements 204. For example, reflected light that is incident on back side surface 202 of image sensor array 130 may be refracted by the surface pattern of etching 206 such that the refracted light is trapped and/or otherwise disrupted at or near the back side of image sensor array 130, and/or in a region of image sensor array 130 between back side surface 202 and image sensor elements 204(*a*)-(*c*), without reaching image sensor elements 204(*a*)-(*c*) of image sensor array 130.

According to some embodiments, a support structure may be formed on at least a portion of back side surface 202 of image sensor array 130. For example, as shown in FIG. 2 at least one support structure 208 may be formed on back side surface 202 surrounding at least a portion of etching 206. Support structure 208 may protect back side surface 202 of image sensor array 130, including etching 206, from damage during wafer-level handling of image sensor array 130. Support structure 208 may be disposed on any suitable portion of back side surface 202. For example, one or more support structures 208 may be formed to peripherally surround at least a portion of etching 206 overlapping image sensor elements 204 of image sensor array 130. In at least one embodiment, support structure 208 may protrude from back side surface 202 so as to extend, in a thickness direction of image sensor array 130, beyond protrusions 300 of etching 206. Accordingly, support structure 208 may ensure that, as image sensor array 130 is handled during processing and/or assembly, support structure 208, rather than etching 206, is contacted by an adjacent surface abutting the back side of image sensor array 130.

Support structure 208 may be formed in any suitable manner, without limitation. According to at least one embodiment, support structure 208 may be formed following formation of etching 206 on back side surface 202. For example, a material layer (e.g., an insulative layer) forming support structure 208 may be deposited on and/or bonded to back side surface 202 following formation of etching 206. In some examples, portions of back side surface 202 corresponding support structure 208 may be selectively etched (using any of the etching techniques described herein) to have a different surface shape and configuration than etching 206. For example, portions of back side surface 202 corresponding to support structure 208 may be etched to have a planar or substantially planar surface profile that facilitates formation of support structure 208. In at least one embodiment, support structure 208 may be formed during formation of etching 206. For example, a silicon die of image sensor array 130 may be selectively etched on portions of back side surface 202 other than support structure 208 to form etching 206, and support structure 208 may include a portion of the silicon die that is not etched during formation of etching 206.

Figure 4:
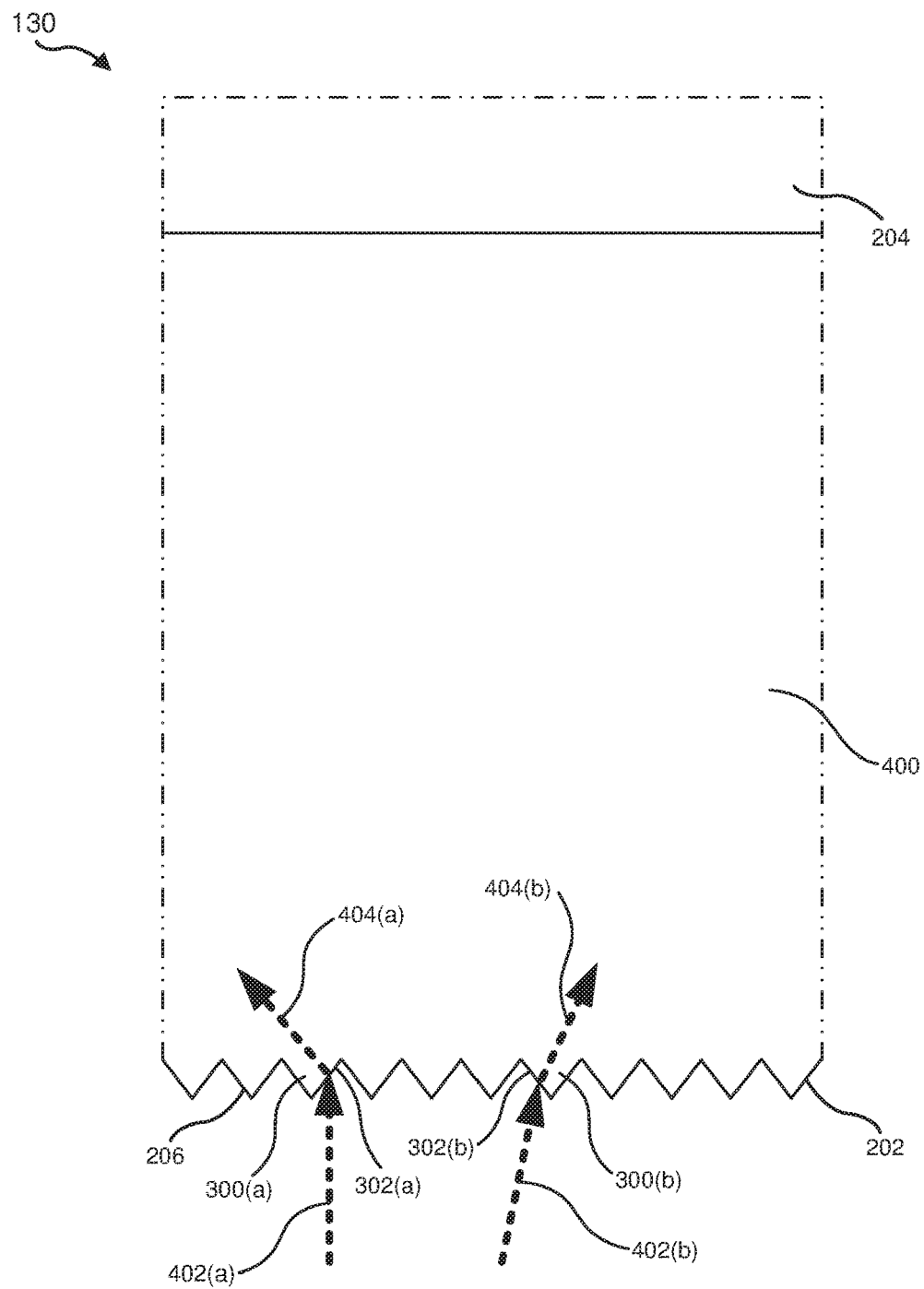
FIG. 4 is a cross-sectional side view of a portion of an exemplary image sensor array with an etched back side surface, in accordance with some embodiments.

FIG. 4 shows a cross-section of a portion of image sensor array 130. As shown in FIG. 4, image sensor array 130 may include an image sensor element 204 and a base region 400 extending between image sensor element 204 and back side surface 202. In some embodiments, as will be described in greater detail below in reference to FIG. 6, an electric field may be applied to image sensor element 204 by electrical circuitry disposed on or in image sensor array 130, enabling image sensor element 204 to collect light by converting light photons into current. Base region 400 may represent a portion of image sensor array 130, such as a portion of a silicon die or substrate of image sensor array 130, to which an electric field is not applied.

In some embodiments, light (e.g., NIR light) incident on front side surface 200 of image sensor array 130 shown in FIG. 2 may pass through image sensor array 130 without being captured by image sensor element 204. Such light may exit through back side surface 202 of image sensor array 130 and may be subsequently reflected back toward back side surface 202 by one or more surfaces (e.g., surface portions of printed circuit board 140) disposed behind image sensor array 130. In some embodiments, light exiting back side surface 202 may be refracted by surface portions of etching 206. Additionally or alternatively, light subsequently reflected toward back side surface 202 may be refracted by surface portions of etching 206.

FIG. 4 illustrates exemplary reflected paths 402(a) and 402(b) of light photons that have been reflected from surfaces behind image sensor array 130. As shown in FIG. 4, reflected light paths 402(a) and 402(b) may intersect a portion of back side surface 202 that includes etching 206. For example, the light photon proceeding along reflected path 402(a) may strike surface portion 302(a) of protrusion 300(a) and the light photon proceeding along reflected path 402(b) may strike surface portion 302(b) of protrusion 300(b). In some examples, as shown in FIG. 4, the light photons following reflected paths 402(a) and 402(b) may respectively strike surface portions 302(a) and 302(b) of etching 206 at incident angles that are not normal to surface portions 302(a) and 302(b). Consequently, the trajectories of the light photons may be changed as they are refracted at surface portions 302(a) and 302(b) of etching 206 such that the light photons follow exemplary refracted paths 404(a) and 404(b). Photons following refracted paths 404(a) and 404(b) would be required to travel a greater distance through base region 400 in order to reach an image sensor element 204 of image sensor array 130 in comparison to photons following a more direct path between back side surface 202 and an image sensor element 204. Accordingly, etching 206 may significantly decrease a likelihood of light photons reaching image sensor elements 204 of image sensor array 130.

In some embodiments, the light photons following refracted paths 404(a) and 404(b) may each pass through a portion of base region 400 of image sensor array 130 before being trapped in base region 400. Additionally or alternatively, light photons may be trapped in base region 400 at or near etching 206 of back side surface 202. In some embodiments, base region 400 may include a crystalline silicon lattice to which an electric field is not applied. As the light photons pass along refracted paths 404(a) and 404(b) from back side surface 202 through base region 400, the light photons may be trapped and/or destroyed within base region 400 prior to reaching an image sensor element 204 and/or a region of image sensor array 130 adjacent to an image sensor element 204. The light photons may be trapped and/or destroyed in in various ways. In one example, the light photons following refracted paths 404(a) and 404(b) may each generate carriers (i.e., an electron-hole pair) in base region 400. In some embodiments, such carrier generation may occur at or near back side surface 202. The resulting carriers may die off (e.g., through electron-hole recombination) in base region 400 before reaching an image sensor element 204 of image sensor array 130. For example, a distance between a site of carrier generation in base region 400 and image sensor element 204 may be greater than a transit distance (i.e., a distance between the site of carrier generation and a site of recombination) of generated carriers in base region 400. According to at least one embodiment, a thickness of base region 400 between image sensor elements 204 and back side surface 202 may be selected such that light photons passing through back side surface 202 and/or carriers generated by such light photons are unable or likely unable to reach the image sensor elements 204. Accordingly, etching 206 formed on back side surface 202 may inhibit or prevent reflected light from reaching image sensor elements 204 of image sensor array 130.

The back side surface 202 of image sensor array 130 may be etched, carved, and/or otherwise modified using a variety of processes. For example, back side surface 202 of image sensor array 130 may be etched using any suitable photo (e.g., laser etching), chemical (e.g., wet etching, plasma etching, etc.), and/or mechanical etching technique and/or any other suitable surface forming and/or cutting technique to remove, add to, and/or otherwise change the surface shape and configuration of back side surface 202 of image sensor array 130, without limitation. In one example, back side surface 202 of image sensor array 130 may be etched using laser etching. In another example, back side surface 202 of image sensor array 130 may be etched by mechanically applying a surface cutting element (e.g., a rough material, such as sandpaper, a cutting element, etc.) to the back side of image sensor array 130.

In additional or alternative examples, light-disrupting element 132 may represent a printable element (i.e., layer) printed on the back side of image sensor array 130 or on the front side of printed circuit board 140. The printable element may, for example, include a material that absorbs, destroys, and/or otherwise disrupts light exiting through the back side of image sensor array 130. In some examples, the printable element may take the form of a specific pattern (e.g., the pyramidal pattern illustrated in FIGS. 2-4). In other examples, the printable element may have no organized pattern. For example, in one embodiment, the printable element may represent a solid block of color. In some embodiments, the printable element may be printed onto the back side of image sensor array 130 using a screen printing and/or any other suitable printing and/or deposition technique.

In some examples, light-disrupting element 132 may represent a light-absorbing layer disposed on the back side of image sensor array 130. Using FIG. 5 as a specific example, light-disrupting element 132 may represent a light-absorbing layer 500 disposed on back side surface 202 of image sensor array 130. Light-absorbing layer 500 may represent any suitable type or form of material that absorbs all or substantially all broadband light or light within a specified wavelength range. For example, light-absorbing layer 500 may absorb at least about 80% of incident light (e.g., at least about 80%, at least about 85%, at least about 90%, at least about 95%, at least about 96%, at least about 97%, at least about 98%, at least about 99% of incident light). In some examples, light-absorbing layer 500 may represent an adhesive adhered to the back of image sensor array 130. In these examples, printed circuit board 140 may be affixed to back side surface 202 of image sensor array 130 using the adhesive. In some examples, a conventional adhesive used for adhering image sensor arrays to printed circuit boards may be altered to include one or more light-disrupting additives (e.g., carbon black dye, NIR absorbing dye, etc.) and then used to adhere image sensor array 130 to printed circuit board 140. In at least one embodiment, light-disrupting element 132 may include a material, such as a light absorbing ink (e.g., a black ink), that is screen printed on back side surface 202 of image sensor array 130.

Figure 6:
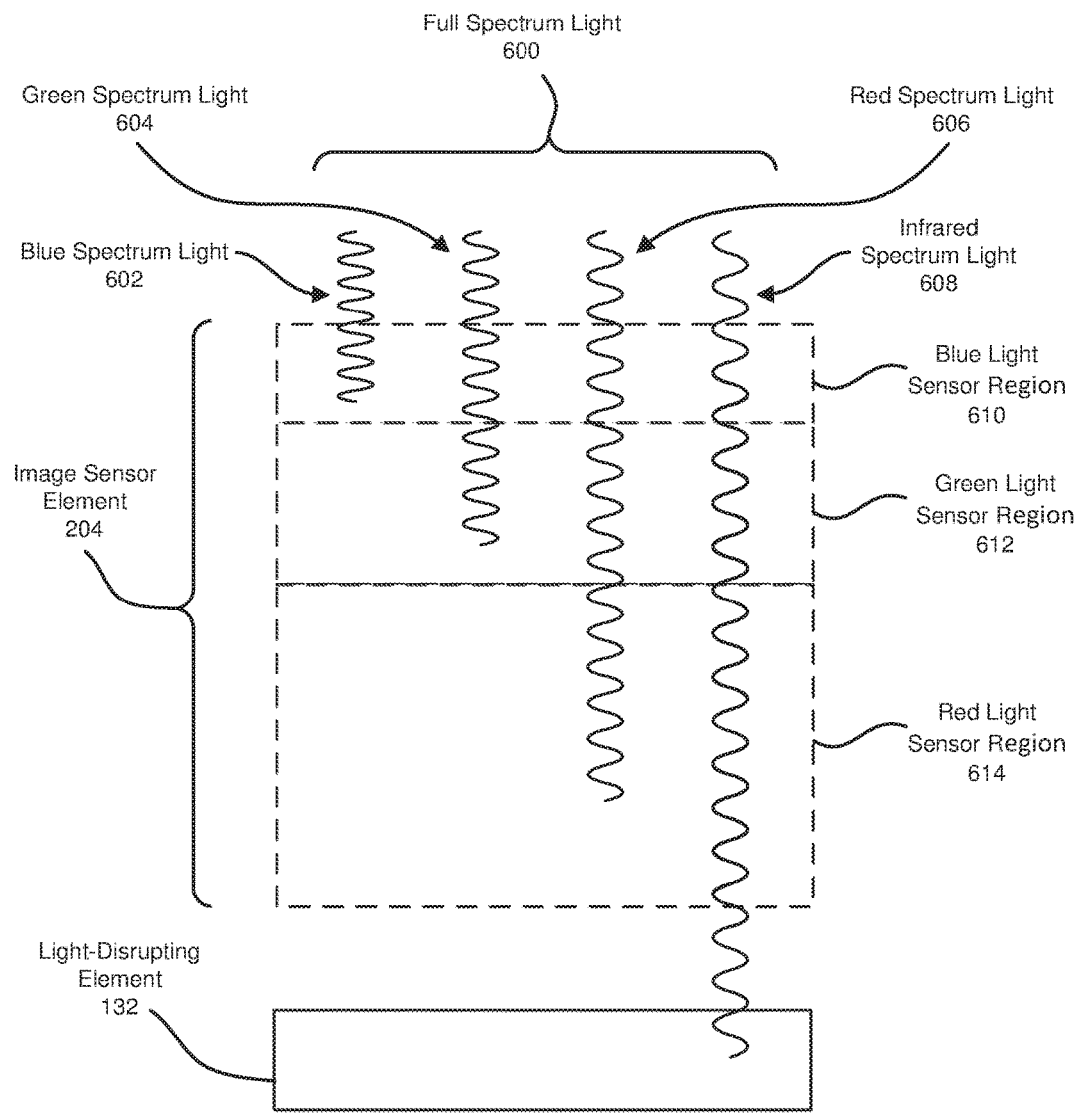
FIG. 6 is a diagram illustrating passage of light components through portions of an exemplary image sensor element, in accordance with some embodiments.

FIG. 6 illustrates various exemplary light waves passing through and/or collected by an image sensor element 204 of image sensor array 130 (see FIGS. 1, 2, 4, and 5). According to some embodiments, image sensor element 204 may represent a light collecting photosensor (e.g., a photodiode, a photo transistor, etc.). Image sensor element 204 may, for example, include a doped semiconductor region of a silicon die or substrate forming image sensor array 130. An electric field may be generated in image sensor element 204 by a current passed through image sensor element 204 by circuitry disposed on and/or in image sensor array 130. Various light components may be collected in image sensor element 204 as light photons are converted into current.

In at least one example, full-spectrum light 600 may pass through image sensor element 204 via front side surface 200 of image sensor array 130 (see FIGS. 1, 2, and 4). Full-spectrum light 600 may include various light components, represented in FIG. 6 by blue spectrum light 602, green spectrum light 604, red spectrum light 606, and infrared spectrum light 608 (i.e., IR and/or NIR light). As shown in FIG. 6, higher energy light having a shorter wavelength may be efficiently collected by image sensor element 204. For example, blue spectrum light 602, which has the highest energy and shortest wavelength, may be collected in a blue light sensor region 610 closest to an entry region of image sensor element 204 (e.g., near front side surface 200 of image sensor array 130 shown in FIGS. 2 and 5). Green spectrum light 604 having a longer wavelength than blue spectrum light 602 may be collected in green light sensor region 612 disposed behind blue light sensor region 610. Red spectrum light 606 having a longer wavelength than green spectrum light 604 may be collected in red light sensor region 614 disposed behind green light sensor region 612. In at least one embodiment, red spectrum light 606 collected by red light sensor region 614 may include NIR light having wavelengths in a lower range of the IR spectrum (e.g., between approximately 700 nm to approximately 900 nm).

In contrast, infrared spectrum light 608, which has a lower energy and longer wavelength than red spectrum light 606, may pass entirely through image sensor element 204 without being collected in any region of image sensor element 204. Infrared spectrum light 608 may continue through image sensor array 130, exiting through back side surface 202 (see FIGS. 2, 4, and 5). As described herein, infrared spectrum light 608 passing through image sensor array 130 may be prevented from reflecting back to image sensor elements 204 of image sensor array 130 by a light-disrupting element 132 disposed at the back side of image sensor array 130. For example, infrared spectrum light 608 may be trapped, destroyed, absorbed, and/or otherwise disrupted by light-disrupting element 132.

Returning to FIG. 1, in one embodiment, imaging device 100 may operate within a system, such as an artificial reality system 150. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality.

Artificial reality system 150 may be implemented on various platforms, including a head-mounted display connected to a host computer system, a standalone head-mounted display, a mobile device or computing system, or any other hardware platform capable of providing artificial reality content to one or more viewers. In some examples, a head-mounted-display device may be a display device or system that is worn on or about a user's head and displays visual content to the user. Head-mounted-display devices may be configured to be mounted to a user's head in a number of ways. Some head-mounted-display devices may be incorporated into glasses or visors. Other head-mounted-display devices may be incorporated into helmets, hats, or other headwear. Examples of head-mounted-display devices may include OCULUS RIFT, GOOGLE GLASS, VIVE, SAMSUNG GEAR, etc.

Figure 8:
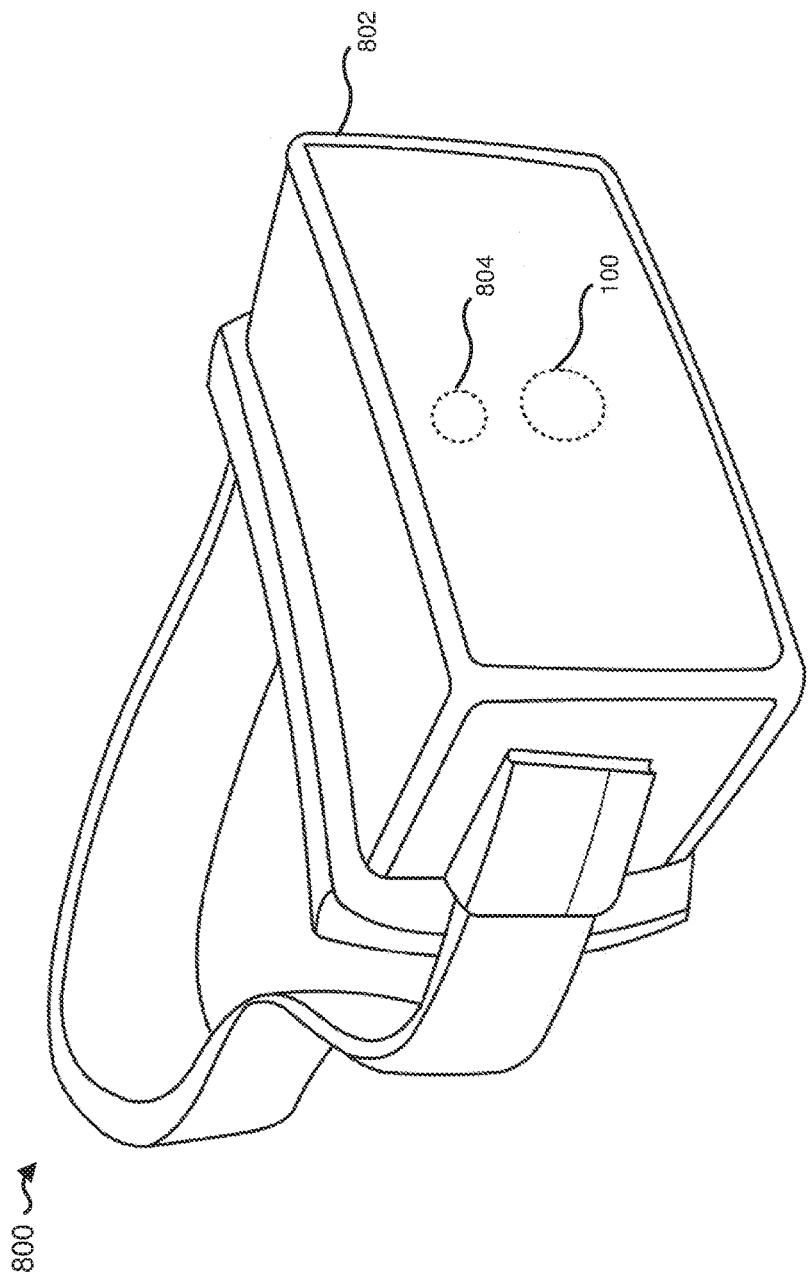
FIG. 8 is a perspective view of an exemplary head-mounted display, which may include the imaging device of FIG. 1, in accordance with some embodiments.
Figure 9:
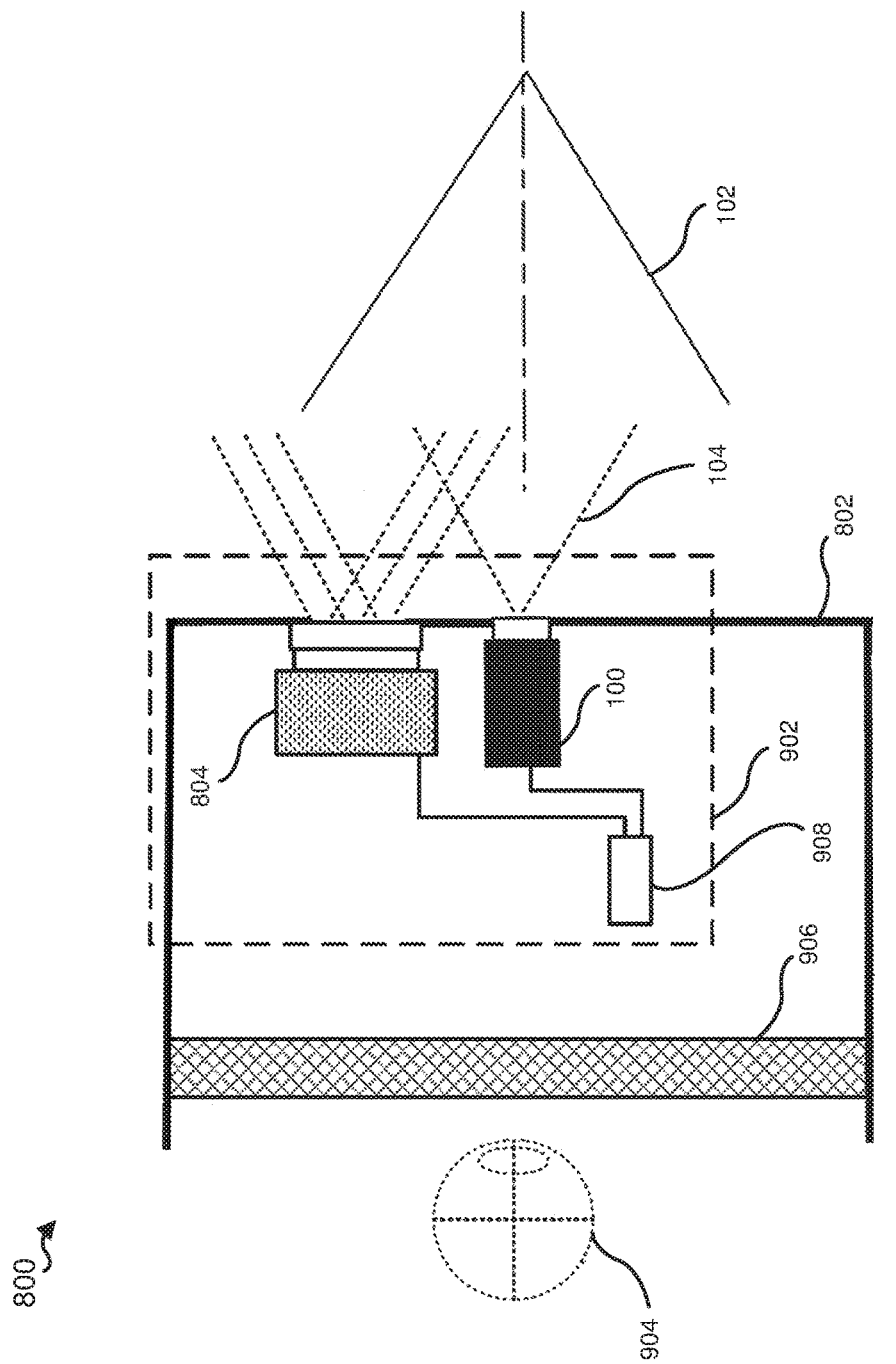
FIG. 9 is a cross-section of the head-mounted display in FIG. 8, in accordance with some embodiments.

Using FIG. 8 as a specific example, artificial reality system 150 may be implemented using a head-mounted display 800. In this example, imaging device 100 may be included within head-mounted display 800. As shown in FIG. 8, head-mounted display 800 may include a front rigid body 802 through which aperture 110 (included within imaging device 100) may receive light. In some such examples, imaging device 100 may operate within a local area imaging assembly, which may be included within head-mounted display 800, as illustrated in FIG. 9. In these examples, as will be discussed in greater detail in connection with FIG. 9, the local area imaging assembly may include an illumination source 804 which may emit light through front rigid body 802 of head-mounted display 800.

FIG. 9 represents a cross section of front rigid body 802 of head-mounted display 800. As shown in FIG. 9, head-mounted display 800 may include a local area imaging assembly 902. In some examples, local area imaging assembly 902 may be a device assembly configured to capture image data that is utilized in determining, mapping, and/or tracking position, orientation, and/or movement of objects within an area, such as local area 102 (e.g., an area surrounding head-mounted display 800). In some examples, local area imaging assembly 902 may include (1) imaging device 100 and (2) illumination source 804 configured to emit light (i.e., a carrier signal) into local area 102.

In some embodiments, local area imaging assembly 902 may determine depth and/or surface information for objects within local area 102 in a variety of ways. For example, local area imaging assembly 902 may be utilized in a simultaneous localization and mapping (SLAM) tracking system to identify and/or map features of local area 102 and/or to identify a location, orientation, and/or movement of head-mounted display 800 and/or other objects (e.g., hand-held controllers, users, etc.) in local area 102. In some examples, illumination source 804 may emit a structured light pattern (e.g., a symmetric and/or quasi-random dot pattern, a grid pattern, horizontal bars, etc.) into local area 102. In these examples, local area imaging assembly 902 may determine the depth and/or surface information based on triangulation or perceived deformation of the emitted pattern. In one embodiment, local area imaging assembly 902 may capture time-of-flight information describing the time required for light emitted from the illumination source to be reflected from one or more objects in local area 102 back to imaging device 100. In this embodiment, local area imaging assembly 902 may determine a distance between local area imaging assembly 902 and the objects based on the time-of-flight information.

In some examples, information collected by local area imaging assembly 902 may be used as part of an image and/or video (e.g., an artificial reality image and/or video) displayed to a user wearing head-mounted display 800. In one example, shown in FIG. 9, the image and/or video may be displayed to a user (e.g., via an eye 904 of the user) via an electronic display 906. Electronic display 906 may represent a single electronic display or multiple electronic displays (e.g., a display for each eye of a user). Examples of electronic display 906 may include, without limitation, a liquid crystal display (LCD), an organic light emitting diode (OLED) display, an inorganic light emitting diode (ILED) display, an active-matrix organic light-emitting diode (AMOLED) display, a transparent organic light emitting diode (TOLED) display, a projector, a cathode ray tube, an optical mixer, and/or some combination thereof. The local area imaging assembly 902 may also include a imaging controller 908 that is coupled to illumination source 804 and/or imaging device 100.

In at least one embodiment, head-mounted display system 150 shown in FIG. 1 may additionally or alternatively include controller tracking features (e.g., constellation tracking). For example, in addition to determining features of local area 102, local area imaging assembly 902 may track a position, orientation, and/or movement of one or more controller devices, such as hand-held controllers, that are utilized by a user for interacting with head-mounted display 800 and/or local area 102.

Figure 10:
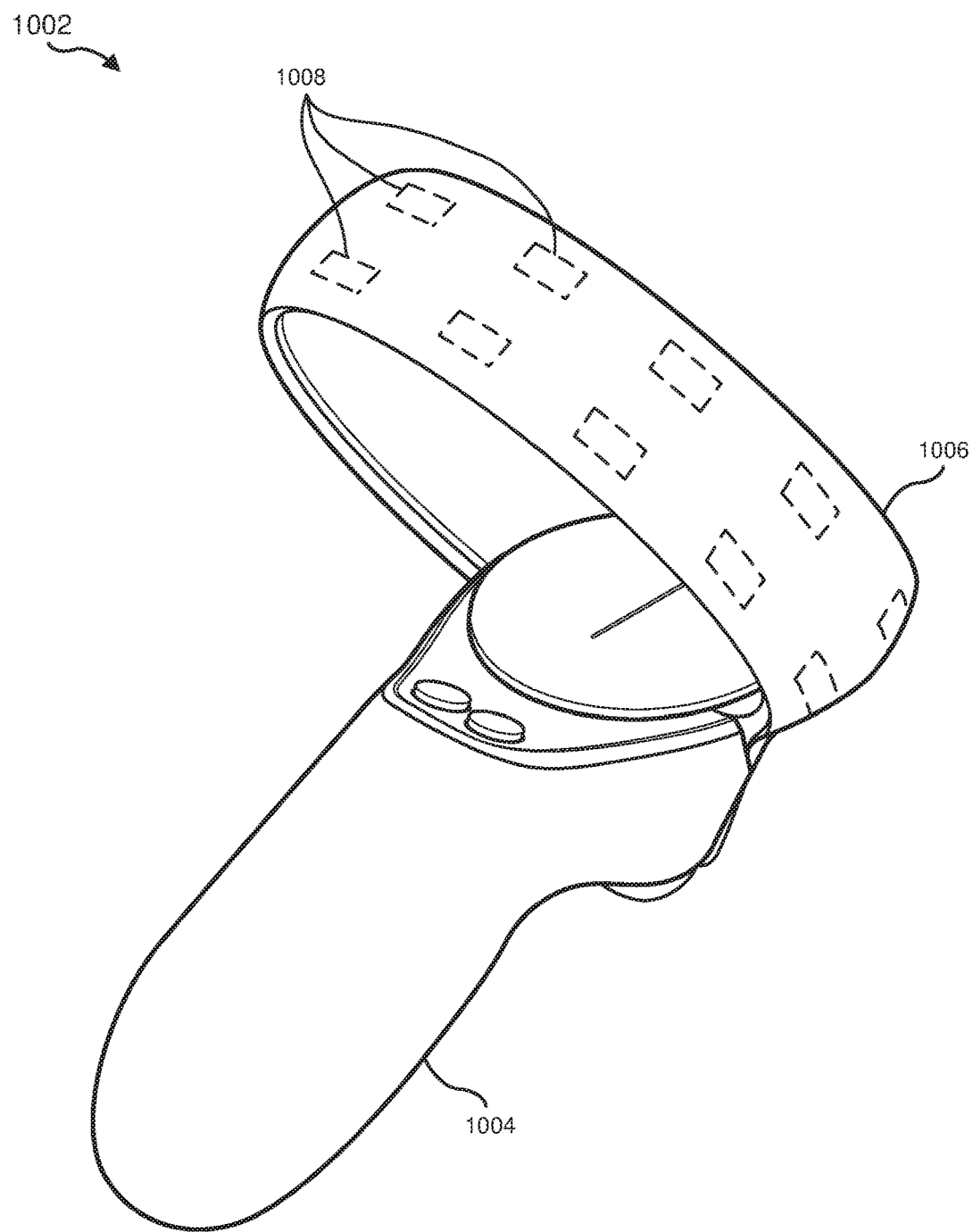
FIG. 10 is a perspective view of an exemplary hand-held controller utilized in artificial reality systems, in accordance with some embodiments.

FIG. 10 is a perspective view of an exemplary hand-held controller 1002 that may be included in head-mounted display system 150 in accordance with some embodiments. Head-mounted-display system 150 may include at least one hand-held controller 1002. For example, head-mounted-display system 150 may include two hand-held controllers 1002, with one hand-held controller 1002 for each of a user's right and left hands. Each hand-held controller 1002 may be communicatively coupled to head-mounted display 800 shown in FIGS. 8 and 9 and/or to a computing device (e.g., a personal computer, a console, etc.) communicatively coupled to head-mounted display 800. Hand-held controller 1002 may be communicatively coupled to head-mounted display 800 via any suitable wireless and/or wired connection.

As shown in FIG. 10, hand-held controller 1002 may include a grip 1004 sized to fit within a user's right or left hand. Hand-held controller 1002 may also include a tracking loop 1006 for tracking position, orientation, and/or movement of hand-held controller 1002 with respect to head-mounted display 800 and/or with respect to local area 102. For example, tracking loop 1006 may include an array of tracking lights 1008, such as tracking LEDs (e.g., IR LEDs), that are used for motion and positional tracking purposes to provide 360-degree motion control while using head-mounted-display system 150. Controller 1002 may additionally or alternatively include tracking lights, such as tracking LEDs, on any other suitable portion of controller 1002. In at least one embodiment, imaging device 100 may receive light emitted by tracking lights 1008 on hand-held controller 1002, such as tracking LEDs on tracking loop 1006, and local area imaging assembly 902 may utilize the received light to determine location, orientation, and/or movement of hand-held controller 1002.

According to some embodiments, local area imaging assembly 902 shown in FIG. 9 may be utilized as part of a hybrid system for (1) SLAM imaging to locate, map, and/or track features of local area 102 (e.g., using depth and/or surface information) and (2) controller tracking to determine location, orientation, and/or movement of one or more hand-held controllers 1002 used by a user of head-mounted display system 150. In one example, local area imaging assembly 902 may utilize light in a mostly visible band for SLAM imaging of local area 102. For example, illumination source 804 of local area imaging assembly 902 may emit light having wavelengths between approximately 400 nm to approximately 700 nm (e.g., approximately 400 nm, approximately 400 nm, approximately 410 nm, approximately 420 nm, approximately 430 nm, approximately 440 nm, approximately 450 nm, approximately 460 nm, approximately 470 nm, approximately 480 nm, approximately 490 nm, approximately 500 nm, approximately 510 nm, approximately 520 nm, approximately 530 nm, approximately 540 nm, approximately 550 nm, approximately 560 nm, approximately 570 nm, approximately 580 nm, approximately 590 nm, approximately 600 nm, approximately 610 nm, approximately 620 nm, approximately 630 nm, approximately 640 nm, approximately 650 nm, approximately 660 nm, approximately 670 nm, approximately 680 nm, approximately 690 nm, approximately 700 nm) in to local area 102. Imaging device 100 may receive and utilize light emitted by illumination source 804 (i.e., light wavelengths between approximately 400 nm to approximately 700 nm) for SLAM tracking and/or mapping of local area 102.

Additionally, local area imaging assembly 902 may track at least one object in local area 102 using light in a different wavelength range than light utilized in SLAM imaging as described above. For example, local area imaging assembly 902 may receive and utilize light in an IR band (e.g., NIR light) for IR tracking of at least one hand-held controller 1002 (see FIG. 10). In one example, hand-held controller 1002 may emit light having wavelengths greater than approximately 700 nm via, for example, an array of IR LEDs (e.g, tracking lights 1008 on tracking loop 1006). For example, tracking lights 1008 of hand-held controller 1002 may emit light having wavelengths between approximately 710 nm to approximately 900 nm (e.g., approximately 710 nm, approximately 720 nm, approximately 730 nm, approximately 740 nm, approximately 750 nm, approximately 760 nm, approximately 770 nm, approximately 780 nm, approximately 790 nm, approximately 800 nm, approximately 810 nm, approximately 820 nm, approximately 830 nm, approximately 840 nm, approximately 850 nm, approximately 860 nm, approximately 870 nm, approximately 880 nm, approximately 890 nm, approximately 890 nm, approximately 900 nm, greater than approximately 900 nm). In one embodiment, tracking lights 1008 of hand-held controller 1002 may emit light having a wavelength of approximately 850 nm (e.g., between approximately 840 nm to approximately 860 nm). Imaging device 100 may receive and utilize IR light emitted by hand-held controller 1002 for tracking location, orientation, and/or movement of hand-held controller 1002 relative to head-mounted display 800 and/or local area 102. Any other suitable ranges of light may be respectively utilized for SLAM imaging and controller tracking, where distinct ranges are utilized for each of the SLAM imaging and controller tracking purposes. In at least one embodiment, separate frames (e.g., alternating frames) captured by imaging device 100 may be respectively utilized by local area imaging assembly 902 for SLAM imaging and controller tracking as described herein. For example, one or more frames captured by imaging device 100 during a time period may be utilized for SLAM imaging and one or more frames captured by imaging device 100 during a subsequent time period may be utilized for controller tracking.

In some examples, a local area imaging assembly (e.g., local area imaging assembly 902) with one or more of the features described above may be disposed within an external sensor device for tracking and/or mapping features of local area 102, portions of head-mounted display system 150 (e.g., head-mounted display 800, hand-held controllers 1002, etc.), and/or one or more users and/or objects within local area 102. In some examples, the external sensor device is a device that is used to detect the position, orientation, and/or motion of an additional device and/or object in a local area of the external sensor device. In one example, the local area imaging assembly may be utilized in an external sensor device that is separate from head-mounted display 800, such as an external sensor bar and/or other suitable external sensor device.

In some examples, the instant disclosure may include a system, such as artificial reality system 150, including a local area imaging assembly, which may include an imaging device, with at least one of the features discussed above. Also, in one embodiment, the instant disclosure may include a method for manufacturing, assembling, using, and/or otherwise configuring or creating a system with one or more of the features described herein.

Figure 11:
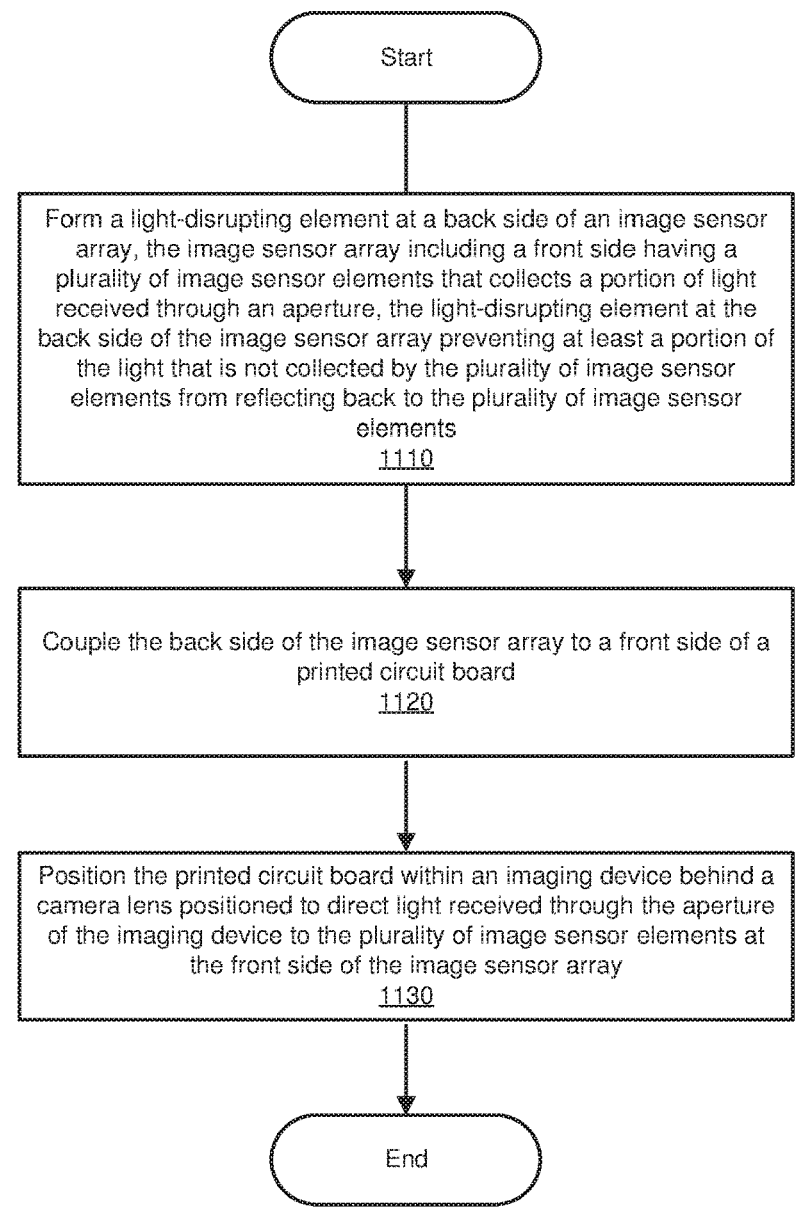
FIG. 11 is a flow diagram of an exemplary method for forming a light-disrupting element for preventing light from passing through an image sensor array, in accordance with some embodiments.

FIG. 11 is a flow diagram of an exemplary method 1100 for forming a light-disrupting element for an image sensor array. As shown in FIG. 11, at step 1110, the method may include forming a light-disrupting element at a back side of an image sensor array with one or more of the features described herein (e.g., with a front side that includes light sensors). The image sensor array may include a front side that includes a plurality of image sensor elements that collect a portion of light received through an aperture. The light-disrupting element at the back side of the image sensor array may prevent at least a portion of the light that is not collected by the plurality of image sensor elements from reflecting back to the plurality of image sensor elements. For example, light-disrupting element 132 may be formed at back side surface 202 of image sensor array 130 (see, e.g., FIGS. 1-6). The method may include forming the light-disrupting element in a variety of ways. In some examples, the method may include forming the light-disrupting element by etching and/or printing the light-disrupting element on the back side of the image sensor array. For example, light-disrupting element 132 may be formed by etching and/or printing a pattern, such as the pyramidal pattern illustrated in FIGS. 2-4, on back side surface 202 of image sensor array 130. In one embodiment, the light-disrupting element may represent a light-absorbing layer (such as light-absorbing layer 500 illustrated in FIG. 5) and the method may include forming the light-disrupting element by coupling the light-absorbing layer to the back side of the image sensor array (e.g., as illustrated in FIG. 5). In one such embodiment, the light-disrupting element may represent an adhesive.

Next, at step 1120, the method may include coupling the back side of the image sensor array to a front side of a printed circuit board with one or more of the features described herein. For example, back side surface 202 of image sensor array 130 may be coupled to a front side surface of printed circuit board 140 (see, e.g., FIGS. 1, 2, and 5). In examples in which the light-disrupting element represents an adhesive light-absorbing layer, the method may include using the adhesive light-absorbing layer to couple the back side of the image sensor array to the front side of the printed circuit board.

Finally, at step 1130, the method may include positioning the printed circuit board within an imaging device, with one or more of the features described herein, behind a camera lens positioned to direct light received through the aperture of the imaging device to the plurality of image sensor elements at the front side of the image sensor array. For example, as illustrated in FIG. 1, printed circuit board 140 (which has been coupled to image sensor array 130) may be positioned within imaging device 100 behind camera lens 120. And, camera lens 120 may be positioned behind aperture 110 to direct light 104 received by aperture 110 to image sensor elements (e.g., image sensor elements 204(*a*)-(*c*) illustrated in FIGS. 2 and 5) at the front side of image sensor array 103. In some examples, the method may also include placing the imaging device within an artificial reality headset, such as a virtual reality headset or an augmented reality headset, such as head-mounted display 800 illustrated in FIGS. 8 and 9, or in an external sensor device.

As discussed throughout the instant disclosure, the disclosed systems, methods, and devices may provide a light-disrupting element, disposed at a back side of an image sensor array, that prevents light from passing through the back side of the image sensor array. The light-disrupting element may be formed in a variety of ways, including (without limitation), by etching the back side of the image sensory array (e.g., using laser etching techniques), by applying a rough material such as sandpaper to the back side of the image sensory array, by printing on the back side of the image sensory array (e.g., using screen printing techniques), and/or by altering an adhesive used to couple the back side of the image sensory array to a printed circuit board (e.g., by adding a carbon black substance to the adhesive). The use of the disclosed light-disrupting elements may eliminate the need for a light-blocking filter, such as an IR cut filter, in an imaging device. Thus, such light-disrupting elements may improve the accuracy and performance of imaging devices while reducing costs associated with additional light-blocking elements, such as light-blocking filters.

The foregoing description, for purposes of explanation, has been described with reference to specific embodiments and has been provided to enable others skilled in the art to best utilize various aspects of the example embodiments disclosed herein. However, the illustrative discussions above are not intended to be exhaustive or to limit the scope of the claims to the precise forms disclosed. Many modifications and variations are possible in view of the above teachings without departing from the spirit and scope of the instant disclosure. The instant disclosure covers all modifications, equivalents, and alternatives falling within the scope of the appended claims. Features from any of the above-mentioned embodiments may be used in combination with one another in accordance with the general principles described herein. The embodiments were chosen to best explain the principles underlying the claims and their practical applications, to thereby enable others skilled in the art to best use the embodiments with various modifications as are suited to the particular uses contemplated. The embodiments disclosed herein should be considered in all respects illustrative and not restrictive. Reference should be made to the appended claims and their equivalents in determining the scope of the instant disclosure.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind." Unless otherwise noted, the terms "connected to," "coupled to," and "attached to" (and their derivatives), as used in the specification and claims, are to be construed as permitting both direct and indirect (i.e., via other elements or components) connection. Furthermore, two or more elements may be coupled together with an adhesive, a clasp, a latch, a hook, a link, a buckle, a bolt, a screw, a rivet, a snap, a catch, a lock, or any other type of fastening or connecting mechanism.

What is claimed is:

1. An imaging device comprising:
   an aperture;
   a camera lens positioned to direct light received through the aperture to a plurality of image sensor elements at a front side of an image sensor array; and
   the image sensor array, wherein:
      the plurality of image sensor elements collects a portion of the light received through the aperture;
      a light-disrupting element is disposed at a back side of the image sensor array, the light-disrupting element comprising an uneven surface etched directly on the back side of the image sensor array; and
      the light-disrupting element at the back side of the image sensor array prevents at least a portion of the light that is not collected by the plurality of image sensor elements from reflecting back to the plurality of image sensor elements.

2. The imaging device of claim 1, wherein the uneven surface comprises a plurality of ridges.

3. The imaging device of claim 1, wherein the uneven surface comprises a plurality of protrusions.

4. The image device of claim 3, wherein each of the plurality of protrusions comprises a plurality of surface portions extending to an apex.

5. The imaging device of claim 1, wherein the uneven surface comprises at least one of a patterned etching or a non-patterned etching.

6. The imaging device of claim 1, wherein the imaging device comprises part of a local area imaging assembly configured to determine a depth between the local area imaging assembly and one or more objects in an area surrounding the local area imaging assembly.

7. The imaging device of claim 1, wherein the imaging device comprises part of a local area imaging assembly configured to track at least one object in an area surrounding the local area imaging assembly.

8. The imaging device of claim 1, wherein the imaging device comprises part of at least one of:
   a virtual reality headset; or
   an augmented reality headset.

9. A system comprising:
   a head-mounted display; and
   an imaging device that comprises:
      an aperture;
      a camera lens positioned to direct light received through the aperture to a plurality of image sensor elements at a front side of an image sensor array; and
      the image sensor array, wherein:
         the plurality of image sensor elements collects a portion of the light received through the aperture;
         a light-disrupting element is disposed at a back side of the image sensor array, the light-disrupting element comprising an uneven surface etched directly on the back side of the image sensor array; and the light-disrupting element at the back side of the image sensor array prevents at least a portion of the light that is not collected by the plurality of image sensor elements from reflecting back to the plurality of image sensor elements.

10. The system of claim 9, further comprising a local area imaging assembly that comprises the imaging device and an illumination source that emits light onto one or more objects in a local area such that the emitted light is reflected back to the local area imaging assembly after reaching the one or more objects, wherein:

the light received through the aperture comprises the light reflected back from the one or more objects; and the local area imaging assembly is configured to determine the depth between the local area imaging assembly and the one or more objects based on the light reflected back from the one or more objects.

11. The system of claim 9, wherein the imaging device is coupled to the head-mounted display.

12. The system of claim 9, wherein the imaging device is coupled to an external sensor device.

13. The system of claim 9, further comprising a hand-held controller that comprises at least one light-emitting element, wherein:

the light received through the aperture comprises light emitted by the at least one light-emitting element of the hand-held controller; and the imaging device comprises part of a local area imaging assembly configured to track the hand-held controller based on the light emitted by the at least one light-emitting element of the hand-held controller.

14. The system of claim 9, wherein the head-mounted display comprises at least one of:
 a virtual reality headset; or
 an augmented reality headset.

15. A method comprising:
 forming a light-disrupting element comprising an uneven surface etching at a back side of an image sensor array, the image sensor array comprising a front side that comprises a plurality of image sensor elements that collects a portion of light received through an aperture, the light-disrupting element at the back side of the image sensor array preventing at least a portion of the light that is not collected by the plurality of image sensor elements from reflecting back to the plurality of image sensor elements;
 coupling the back side of the image sensor array to a front side of a printed circuit board; and
 positioning the printed circuit board within an imaging device behind a camera lens positioned to direct light received through the aperture of the imaging device to the plurality of image sensor elements at the front side of the image sensor array.

16. The method of claim 15, wherein the uneven surface comprises at least one of a plurality of protrusions or a plurality of ridges.

17. The method of claim 15, further comprising placing the imaging device within at least one of:
 a virtual reality headset; or
 an augmented reality headset.

18. The method of claim 15, wherein forming the light-disrupting element comprises laser etching the back side of the image sensor array.

19. The method of claim 15, wherein forming the light-disrupting element comprises at least one of wet etching or plasma etching the back side of the image sensor array.

20. The method of claim 15, wherein forming the light-disrupting element comprises mechanically applying a surface cutting element to the back side of the image sensor array.

* * * * *

UNITED STATES PATENT AND TRADEMARK OFFICE
CERTIFICATE OF CORRECTION

| | |
|---|---|
| PATENT NO. | : 10,475,834 B1 |
| APPLICATION NO. | : 15/727547 |
| DATED | : November 12, 2019 |
| INVENTOR(S) | : Manoj Bikumandla et al. |

Page 1 of 1

It is certified that error appears in the above-identified patent and that said Letters Patent is hereby corrected as shown below:

In the Claims

In Column 16, Line 37, Claim 4, delete "image" and insert -- imaging --, therefor.

Signed and Sealed this
Fourth Day of February, 2020

Andrei Iancu
*Director of the United States Patent and Trademark Office*